US012701732B2

(12) United States Patent
Yang et al.

(10) Patent No.: US 12,701,732 B2
(45) Date of Patent: Aug. 4, 2026

(54) LDMOS TRANSISTOR DEVICE AND METHOD FOR FORMING THE SAME

(71) Applicant: TAIWAN SEMICONDUCTOR MANUFACTURING COMPANY LTD., Hsinchu (TW)

(72) Inventors: Tsung-Hua Yang, Tainan City (TW);
Cheng-Bo Shu, Tainan City (TW);
Chia-Ta Hsieh, Tainan (TW);
Ping-Cheng Li, Kaohsiung City (TW);
Po-Wei Liu, Tainan City (TW);
Shih-Jung Tu, Tainan City (TW);
Tsung-Yu Yang, Tainan City (TW);
Yun-Chi Wu, Tainan City (TW);
Yu-Wen Tseng, Chiayi City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 384 days.

(21) Appl. No.: 18/299,076

(22) Filed: Apr. 12, 2023

(65) Prior Publication Data

US 2024/0347626 A1    Oct. 17, 2024

(51) Int. Cl.
H10D 30/01 (2025.01)
H10D 30/65 (2025.01)
(Continued)

(52) U.S. Cl.
CPC ......... H10D 30/0281 (2025.01); H10D 30/65 (2025.01); H10D 62/116 (2025.01);
(Continued)

(58) Field of Classification Search
CPC ........... H10D 30/0221; H10D 30/0223; H10D 30/0281; H10D 30/603; H10D 30/65;
(Continued)

(56) References Cited

U.S. PATENT DOCUMENTS

| | | | |
|---|---|---|---|
| 2011/0220995 A1* | 9/2011 | Chou .................. | H10D 30/603 |
| | | | 257/E29.256 |
| 2015/0279969 A1* | 10/2015 | Levy ................ | H01L 21/02233 |
| | | | 438/286 |

(Continued)

OTHER PUBLICATIONS

Chen, S. Y., Liao, B., Dong, J. C., Wang, T., Wang, S. L., Yang, H. Y., . . . & Gan, J. Y. (2021). Study on 20 V LDMOS With Stepped-Gate-Oxide Structure for PMIC Applications: Design, Fabrication, and Characterization. IEEE Transactions on Electron Devices, 69(2), 878-881.

*Primary Examiner* — Shaun M Campbell
(74) *Attorney, Agent, or Firm* — WPAT LAW; Anthony King

(57) ABSTRACT

An LDMOS transistor device includes a stepped isolation structure over a substrate, a gate electrode disposed over a portion of the stepped isolation structure, a source region disposed in the substrate, and a drain region disposed in the substrate. The stepped isolation structure includes a first portion having a first thickness, and a second portion having a second thickness greater than the first thickness. The second portion includes dopants. The drain region is adjacent to the stepped isolation structure.

20 Claims, 9 Drawing Sheets

100

(51) Int. Cl.
    *H10D 62/10*       (2025.01)
    *H10D 62/17*       (2025.01)
    *H10P 30/20*       (2026.01)
    *H10P 30/22*       (2026.01)

(52) U.S. Cl.
    CPC ......... *H10D 62/393* (2025.01); *H10P 30/204*
        (2026.01); *H10P 30/21* (2026.01); *H10P 30/22*
                                           (2026.01)

(58) Field of Classification Search
    CPC .. H10D 62/116; H10D 62/393; H10D 64/516;
             H10D 84/83; H01L 21/26513; H01L
             21/266; H10P 30/204; H10P 30/21; H10P
                                      30/22
    See application file for complete search history.

(56)                         References Cited

U.S. PATENT DOCUMENTS

| | | | |
|---|---|---|---|
| 2017/0271482 A1* | 9/2017 | Jung .................... | H10D 30/603 |
| 2022/0199828 A1* | 6/2022 | Mehrotra ............. | H10D 84/834 |
| 2023/0136827 A1* | 5/2023 | Xue ....................... | H10D 62/83 |
| | | | 257/339 |

* cited by examiner

10

106a

107

106b

102

104a    104b

11

109

106a

107

106b

111

102

104a    104b

16

100

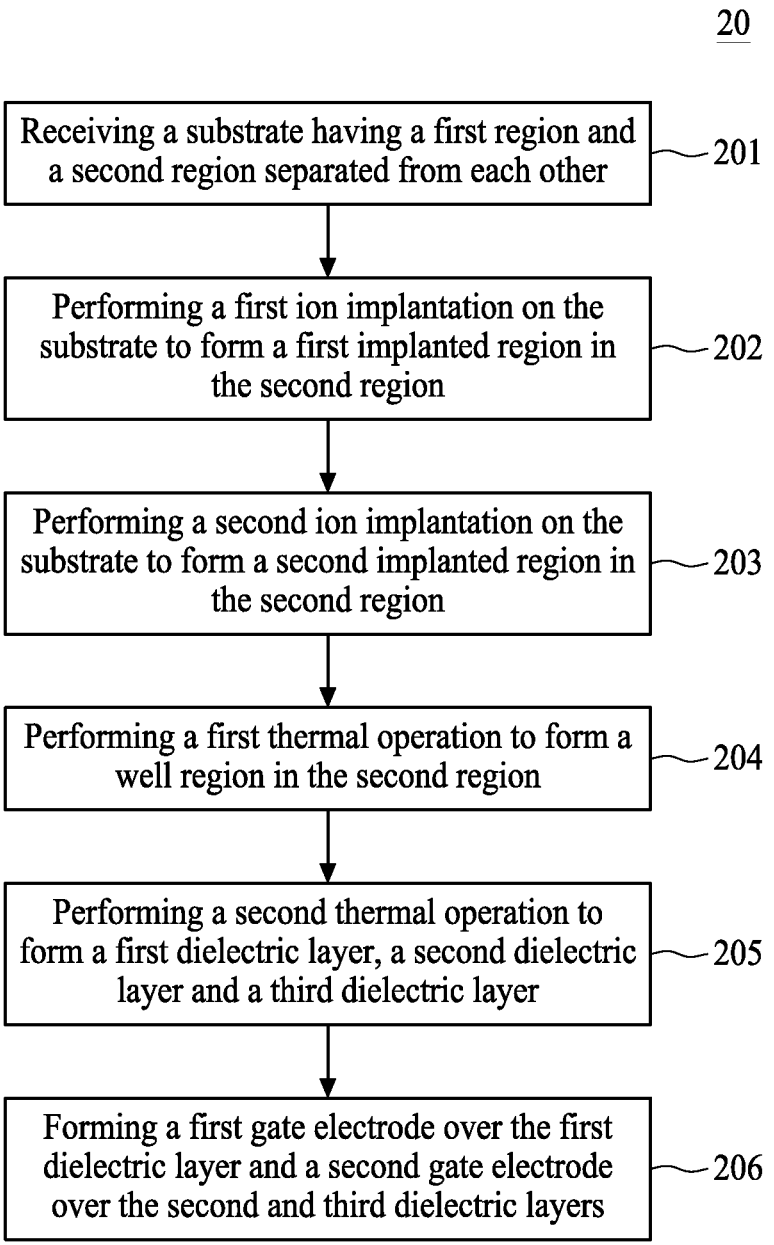

20

Receiving a substrate having a first region and a second region separated from each other ⟋ 201

Performing a first ion implantation on the substrate to form a first implanted region in the second region ⟋ 202

Performing a second ion implantation on the substrate to form a second implanted region in the second region ⟋ 203

Performing a first thermal operation to form a well region in the second region ⟋ 204

Performing a second thermal operation to form a first dielectric layer, a second dielectric layer and a third dielectric layer ⟋ 205

Forming a first gate electrode over the first dielectric layer and a second gate electrode over the second and third dielectric layers ⟋ 206

FIG. 2

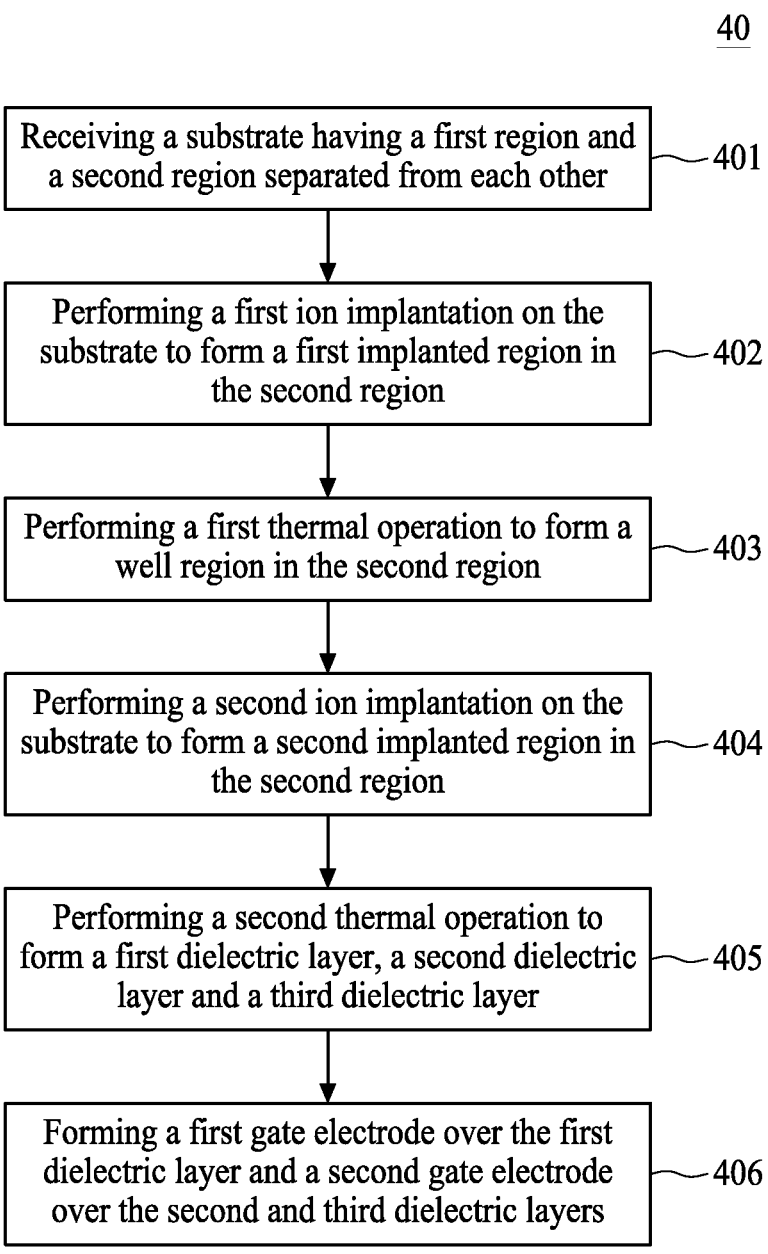

40

Receiving a substrate having a first region and a second region separated from each other — 401

Performing a first ion implantation on the substrate to form a first implanted region in the second region — 402

Performing a first thermal operation to form a well region in the second region — 403

Performing a second ion implantation on the substrate to form a second implanted region in the second region — 404

Performing a second thermal operation to form a first dielectric layer, a second dielectric layer and a third dielectric layer — 405

Forming a first gate electrode over the first dielectric layer and a second gate electrode over the second and third dielectric layers — 406

FIG. 4

LDMOS TRANSISTOR DEVICE AND METHOD FOR FORMING THE SAME

BACKGROUND

Technological advances in semiconductor integrated circuit (IC) materials, design, processing, and manufacturing have enabled continual reduction in sizes of IC devices, where each generation has smaller and more complex circuits than the previous generation.

As semiconductor circuits composed of devices such as metal-oxide-semiconductor field-effect transistors (MOSFETs) are adapted for high-voltage applications, such as high-voltage lateral diffusion metal-oxide-semiconductor (HV LDMOS) transistor devices, problems arise with respect to decreasing voltage performance as the downscaling continues with advanced technologies. To prevent punch-through between source and drain, or to reduce resistance of the source and drain, standard MOS fabrication process flows may be accompanied by multiple implantations with high doping concentrations. Substantial substrate leakage and voltage breakdown occur, causing degradation of device reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a flowchart representing a method for forming an LDMOS transistor device according to aspects of the present disclosure.

FIG. 4 is a flowchart representing a method for forming an LDMOS transistor device according to aspects of the present disclosure.

DETAILED DESCRIPTION

Figure 1A:
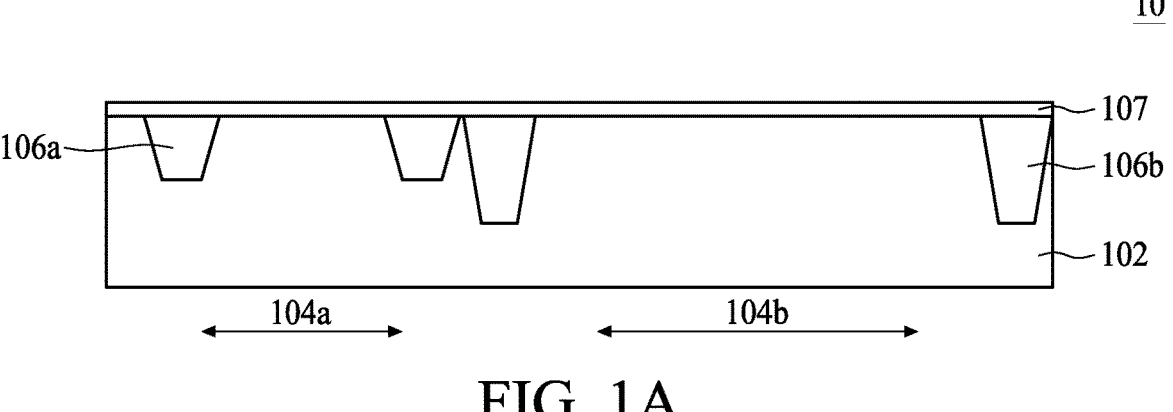
FIGS. 1A to 1H are schematic cross-sectional views of various stages in a formation of an LDMOS transistor device according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat references numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation are merely intended for convenience of description and are not intended in any way to limit the scope of the present disclosure. Relative terms such as "lower," "upper," "horizontal," "vertical," "above," "below," "up," "down," "top" and "bottom," as well as derivatives thereof (e.g., "horizontally," "downwardly," "upwardly," etc.), should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

On-state breakdown voltage and on-resistance (R-on) are two important characteristics of a lateral diffusion metal-oxide-semiconductor (LDMOS) transistor device used in a circuit. In some embodiments, the LDMOS transistor device is constructed to have field plates. The field plates are conductive elements, which are placed over a channel region of the LDMOS transistor device. Further, the field plates may extend from the channel region to an adjacent drift region disposed between the channel region and a drain region. The field plates are disposed to enhance performance of the LDMOS transistor device by altering or modulating electric fields (e.g., reducing peak electric fields) generated by a gate electrode. Due to the altering the electric fields, a breakdown voltage of the LDMOS transistor device is increased. In some embodiments, a gate structure (e.g., a polysilicon gate electrode) of the LDMOS transistor device may be extended to create an overlap with the drift region of the LDMOS transistor device. Such overlap functions as a field plate to increase the breakdown voltage of the LDMOS transistor device.

To further improve effects of the field plates, other elements of the LDMOS transistor device are modified. In some comparative approaches, a field oxide (FOX) is used, but such approach suffers from complicated processing and negative impacts on logic devices. In other comparative approaches, an isolation structure, such as a shallow trench isolation (STI) under the gate electrode and the field plates, is employed. However, such approach suffers from increased R-on issue because a conduction path is re-routed by the STI. In other comparative approaches, a dual STI, which includes STI structures with different thicknesses, is provided. However, such approach suffers from complicated processing and negative impacts on logic devices, and also suffered from the re-routing of the conduction path.

The present disclosure therefore provides an LDMOS transistor device having a stepped isolation structure and a method for forming the same. In some embodiments, the method uses an ion implantation for forming the stepped isolation structure; as result, the manufacturing operations are simplified and impacts on the logic devices are mitigated. Accordingly, the breakdown voltage of the LDMOS transistor device is increased, and the on-resistance of the LDMOS transistor device is reduced due to the stepped isolation structure.

FIGS. 1A to 1H are schematic cross-sectional views of various stages in a formation of an LDMOS transistor device according to aspects of the present disclosure in one or more embodiments. The corresponding operations are also reflected schematically in the process flow shown in FIG. 2.

Referring to FIG. 1A, in some embodiments, a substrate 102 is received or provided. The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, the SiGe alloy can be mechanically strained by another material in contact with the SiGe alloy. Furthermore, the substrate 102 may be a semiconductor on insulator, such as silicon on insulator (SOI). In some embodiments, the substrate 102 may include a doped epitaxial layer or a buried layer. In some embodiments, the substrate 102 may have a multilayer structure, or may include a multilayer compound semiconductor structure. The substrate 102 has a first conductivity type. In some embodiments, the first conductivity type may be p-type.

Further, the substrate 102 may have a first region 104a and a second region 104b defined thereon. The substrate 102 may include isolation structures, e.g., shallow trench isolation (STI) structures 106a and 106b interposing the first and second regions 104a and 104b. The first and second regions 104a and 104b are defined for accommodating different devices. In some embodiments, the first region 104a may be a logic region where logic devices are to be formed, and the second region 104b may be an LDMOS region where an LDMOS transistor device is to be formed. In some embodiments, a depth of the isolation structure 106a for defining the logic region 104a may be less than a depth of the isolation structure 106b for defining the LDMOS region 104b, but the disclosure is not limited thereto.

In some embodiments, a sacrificial layer 107 may be formed over the substrate 102. In some embodiments, the sacrificial layer 107 covers a top surface of the substrate 102 and top surfaces of the STIs 106a and 106b. The sacrificial layer 107 may be used for ion implantation screening and reduction of the channel effect during subsequent ion implantation. In such embodiments, the sacrificial layer 107 serves as a screen layer. The sacrificial layer 107 may be an oxide layer. The formation of the sacrificial layer 107 may include, for example but not limited thereto, deposition such as physical vapor deposition (PVD) or chemical vapor deposition (CVD). The sacrificial layer 107 may be omitted in some embodiments.

Figure 1B:
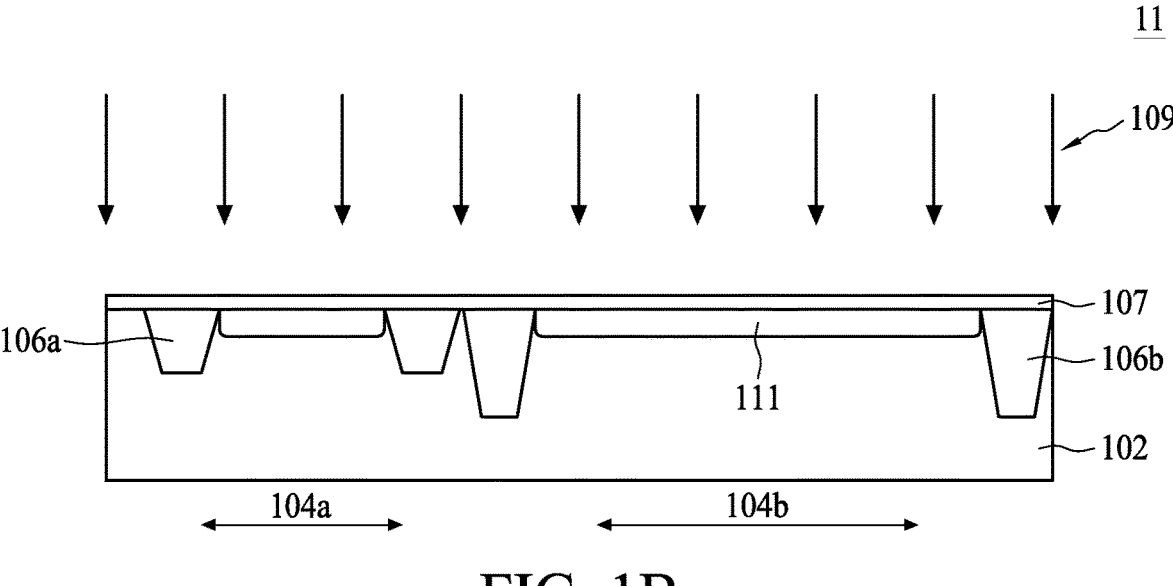

Referring to FIG. 1B, in some embodiments, a first ion implantation 109 is performed on the substrate 102 to form a first implanted region 111 in the second region 104b. In some embodiments, a patterned mask layer (not shown) is formed over the substrate 102 such that regions desired to be impervious to the first ion implantation 109 are covered and protected from the first ion implantation 109. In some embodiments, the first implanted region 111 may be formed in the first region 104a, though not shown. In some embodiments, the first ion implantation 109 implants ions or dopants of a second conductivity type, which is complementary to the first conductivity type, into the second region 104b and/or the first region 104a. The second conductivity type may be n-type. In some embodiments, the n-type dopants include arsenic (As), phosphorus (P), other group V elements, or a combination thereof.

In some embodiments, the first ion implantation 109 is performed for forming a well region in the first region 104a; therefore, a dosage concentration and an energy of the first ion implantation 109 should be well known to persons familiar with the art. Accordingly, details of the first ion implantation 109 are omitted herein.

Figures 1C, 1D:
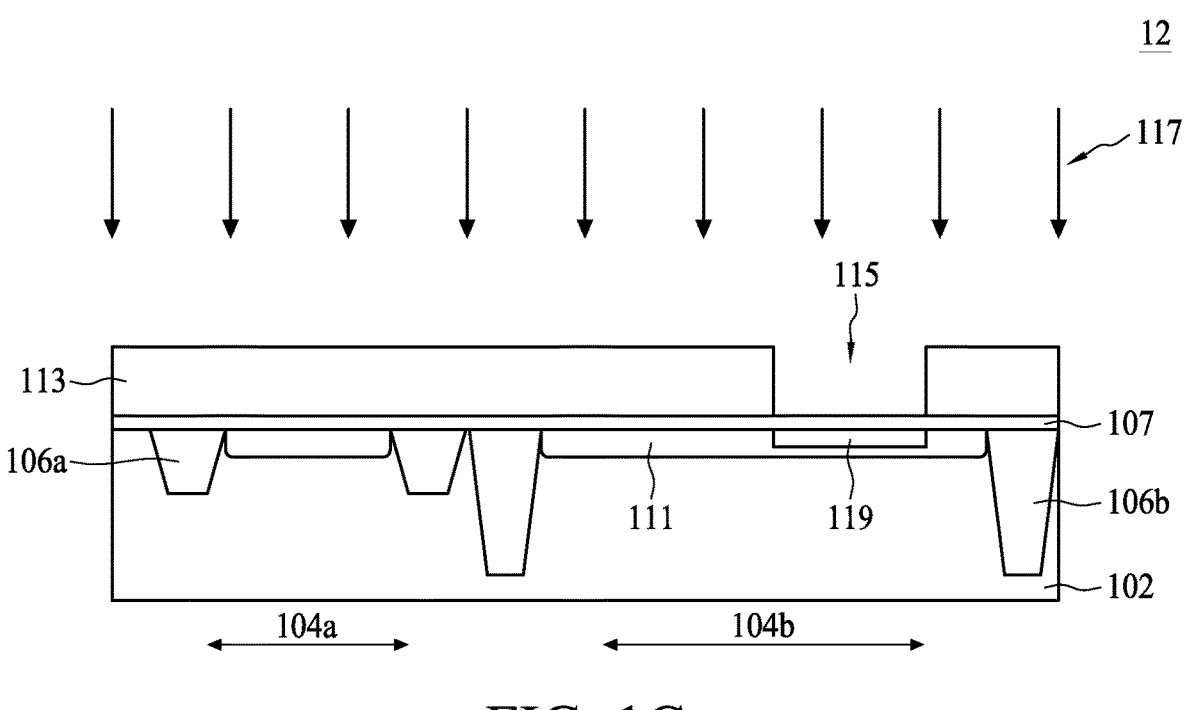

Referring to FIG. 1C, in some embodiments, the above-mentioned patterned mask layer used in the first ion implantation 109 is removed, and another patterned mask layer, such as a patterned photoresist layer 113, is formed over the substrate 102. As shown in FIG. 1C, the patterned photoresist layer 113 includes an opening 115 exposing a portion of the second region 104b, and covers other portions of the substrate 102.

Still referring to FIG. 1C, a second ion implantation 117 is subsequently performed on the substrate 102. In some embodiments, the second ion implantation 117 implants ions such as arsenic (As), germanium (Ge), silicon (Si) or inert ions, but the disclosure is not limited thereto. In some embodiments, the inert ions include xenon (Xe), but the disclosure is not limited thereto. In some embodiments, a dosage of the second ion implantation 117 is between approximately $1 \times 10^{14}$ ions/cm$^2$ and $5 \times 10^{15}$ ions/cm$^2$, and an energy of the second implantation 117 is between approximately 5 KeV and approximately 30 KeV, but the disclosure is not limited thereto. Accordingly, a second implanted region 119 is formed in the second region 104b, as shown in FIG. 1C. A depth of the second implanted region 119 is between approximately 10 angstroms and approximately 300 angstroms, but the disclosure is not limited thereto.

In some embodiments, the second implanted region 119 is formed in the first implanted region 111. In some embodiments, a depth of the second implanted region 119 is equal to or less than a depth of the first implanted region 111. Further, an area of the second implanted region 119 is less than an area of the first implanted region 111. In other words, a width of the second implanted region 119 is less than a width of the first implanted region 111 in a cross-sectional view, as shown in FIG. 1C.

In some embodiments, the second ion implantation 117 can be performed to damage a lattice arrangement of the semiconductor material (e.g., silicon) of the substrate 102 in the second region 104b during the forming of the second implanted region 119. In some embodiments, the second ion implantation 117 can be performed with the abovementioned dosage and energy that are sufficient to amorphize the portion of the substrate 102 exposed through the opening 115. In such embodiments, the second implanted region 119 may be referred to as an amorphized region in the second region 104b.

Referring to FIG. 1D, in some embodiments, the patterned photoresist layer 113 is removed, and a thermal operation 121 is performed on the substrate 102 to form a well region 122. In some embodiments, the thermal operation 121 is performed to drive the ions of the second ion implantation 117 from the first implanted region 111 into the substrate 102. In some embodiments, a temperature of the thermal operation 121 ranges from approximately 950° C. to approximately 1050° C., and a process time of the thermal operation 121 is between approximately 10 seconds and approximately 30 seconds, but the disclosure is not limited thereto. Accordingly, the well region 122 is formed, as shown in FIG. 1D. In some embodiments, a bottom of the well region 122 is in contact with the substrate 102. However, in some embodiments, other well regions or doped regions may be disposed between the bottom of the well region 122 and the substrate 102, though not shown. The well region 122 can be referred to as a drift region. In some embodiments, the well region 122 can be referred to as a high-voltage n-type well (HVNW).

Figure 1E:
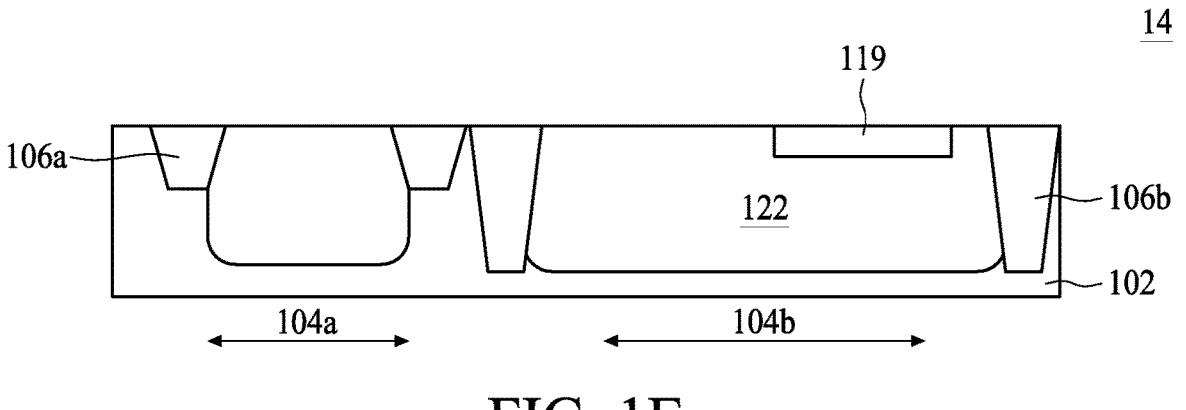

Referring to FIG. 1E, after the forming of the well region 122, the sacrificial layer 107 is removed. Accordingly, a top surface of the well region 122 and a top surface of the second implanted region 119 are exposed.

Figure 1F:
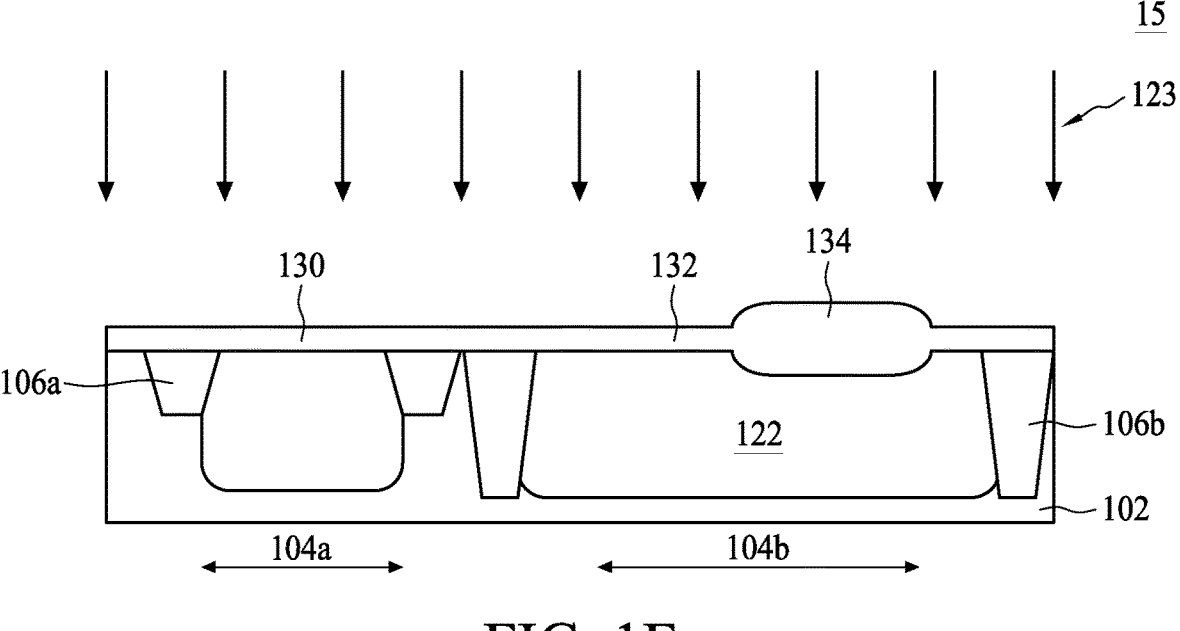

Referring to FIG. 1F, a thermal operation 123 is performed. In some embodiments, a temperature of the thermal operation 123 ranges from approximately 700° C. to approximately 1000° C., and a process time of the thermal operation 123 is between approximately 10 minutes and approximately 60 minutes, but the disclosure is not limited thereto. In some embodiments, a first dielectric layer 130 is formed over the substrate 102 in the first region 104a, a second dielectric layer 132 is formed over the substrate 102 in a portion of the second region 104b, and a third dielectric layer 134 is formed over the substrate 102 in another portion of the second region 104b. Further, the third dielectric layer 134 is formed in the second implanted region 119. The first, second and third dielectric layers 130, 132 and 134 are coupled together, and include a same material, such as silicon oxide. A thickness of the first dielectric layer 130 and a thickness of the second dielectric layer 132 are the same.

In some embodiments, a top surface of the first dielectric layer 130 and a top surface of the second dielectric layer 132 are aligned (i.e., coplanar) with each other. Further, a bottom surface of the first dielectric layer 130 and a bottom surface of the second dielectric layer 132 are aligned (i.e., coplanar) with the top surface of the substrate 102, as shown in FIG. 1F.

In some embodiments, because the lattice arrangement of the semiconductor material of the second implanted region 119 is damaged, an oxidation rate of the semiconductor material of the second implanted region 119 is increased. Consequently, an oxide growth rate is increased. Thus, a thickness of the third dielectric layer 134 formed in the second implanted region 119 is greater than the thickness of the first dielectric layer 130 and greater than the thickness of the second dielectric layer 132. In some embodiments, a top surface of the third dielectric layer 134 is misaligned (i.e., nonplananr) with the top surface of the first dielectric layer 130 and the top surface of the second dielectric layer 132. A bottom surface of the third dielectric layer 134 is misaligned (i.e., nonplanar) with the bottom surface of the first dielectric layer 130 and the bottom surface of the second dielectric layer 132. Further, the top surface and the bottom surface of the third dielectric layer 134 are both misaligned with the top surface of the substrate 102. In some embodiments, the bottom surface of the third dielectric layer 134 is lower than the surface of the substrate 102, as shown in FIG. 1F. In some embodiments, a thickness of the third dielectric layer 134 may be between approximately 400 angstroms and approximately 800 angstroms, but the disclosure is not limited thereto.

Figure 1G:
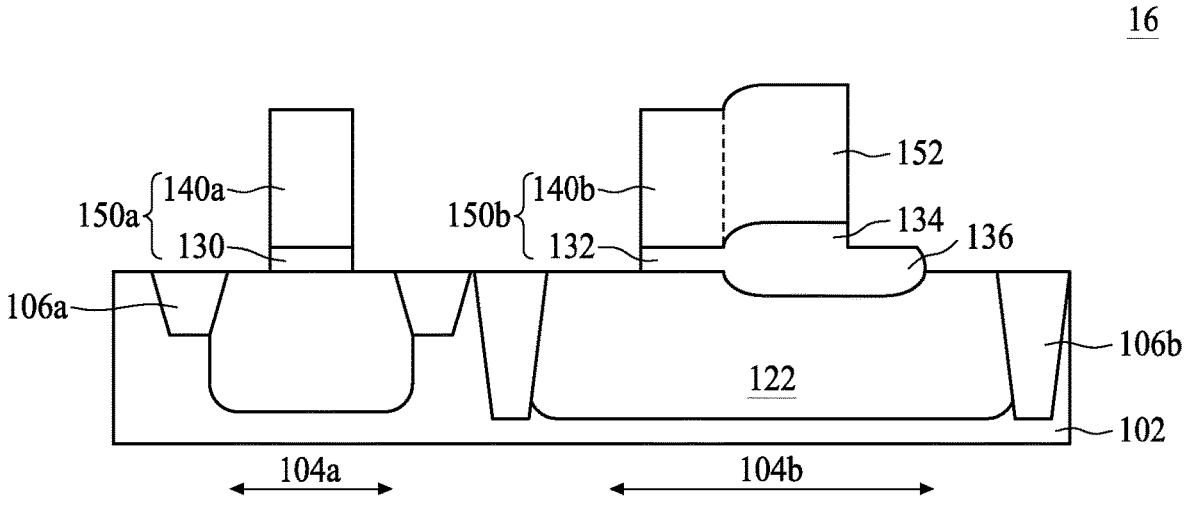

Referring to FIG. 1G, a gate layer, is formed over the substrate 102 and patterned. Accordingly, a first gate electrode 140a is formed in the first region 104a, and a second gate electrode 140b is formed in the second region 104b. The gate layer may be formed of polysilicon, polysilicon germanium, nickel silicide or other metal alloy materials. In some embodiments, the first dielectric layer 130 is also patterned. Thus, the first gate electrode 140a and the patterned first dielectric layer 130 form a first gate structure 150a. The second gate electrode 140b is formed over the second dielectric layer 132. The second dielectric layer 132 is also patterned, and the second gate electrode 140b and the patterned second dielectric layer 132 form a second gate structure 150b. In some embodiments, the semiconductor layer is also patterned to form a field plate 152 over the third dielectric layer 134. As shown in FIG. 1G, the field plate 152 is coupled to the second gate electrode 140b. In some embodiments, a portion of the third dielectric layer 134 is covered by the field plate 152, and another portion of the third dielectric layer 134 is removed to form a fourth dielectric layer 136 that is coupled to the third dielectric layer 134. In such embodiments, a thickness of the fourth dielectric layer 136 is less than the thickness of the third dielectric layer 134. However, the thickness of the fourth dielectric layer 136 is greater than the thickness of the first dielectric layer 130 and the thickness of the second dielectric layer 132.

Figure 1H:
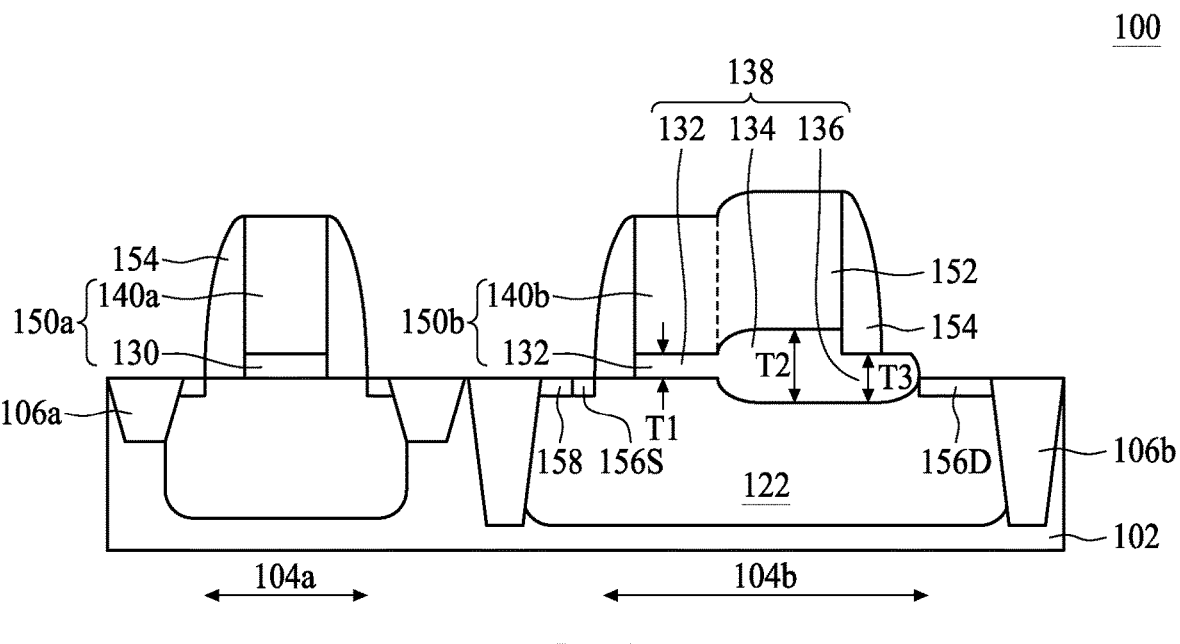

Referring to FIG. 1H, in some embodiments, spacers 154 are formed over sidewalls of the first and second gate structures 150a and 150b. In some embodiments, the spacers 154 are made of silicon nitride (SiN), silicon carbide (SiC), silicon oxide (SiO$_x$), silicon oxynitride (SiON), silicon carbide or any other suitable material, but the disclosure is not limited thereto.

Still referring to FIG. 1H, a source region 156S and a drain region 156D are formed in the substrate 102 in the second region 104*b*. In some embodiments, further doped regions may be formed in the substrate 102 in the second region 104*b*. For example, a doped region is formed adjacent to the source region 156S, and serves as a body region 158. The source region 156S and the drain region 156D include dopants of the second conductivity type, and the body region 158 includes dopants of the first conductivity type. In some embodiments, in order to mitigate a body effect, the body region 158 may be coupled to the source region 156S directly through a source contact (not shown).

Additionally, doped regions for serving as source region and drain region may be formed in the first region 104*a* of the substrate 102 before, during or after the forming of the source region 156S and the drain region 156D.

In some embodiments, other doped regions and/or well regions may be formed prior to the forming of the source region 156S, the drain region 156D and the body region 158, but the disclosure is not limited thereto.

Accordingly, an LDMOS transistor device 100 is obtained. The LDMOS transistor device 100 includes a stepped isolation structure 138 disposed over the substrate 102. The stepped isolation structure 138 has a first portion 132 (also referred to as the second dielectric layer), a second portion 134 (also referred to as the third dielectric layer), and a third portion 136 (also referred to as the fourth dielectric layer). The first portion 132, the second portion 134 and the third portion 136 are coupled. Further, the second portion 134 is disposed between the third portion 136 and the first portion 132.

The first portion 132 has a thickness T1, which is measured from a top surface of the first portion 132 to a bottom surface of the first portion 132. The second portion 134 has a thickness T2, which is measured from a top surface of the second portion 134 to a bottom surface of the second portion 134. The third portion 136 has a thickness T3, which is measured from a top surface of the third portion 136 to a bottom surface of the third portion 136. The thickness T2 of the second portion 134 is greater than the thickness T1 of the first portion 132, and greater than the thickness T3 of the third portion 136. In some embodiments, the thickness T3 of the third portion 136 is greater than the thickness T1 of the first portion 134, but the disclosure is not limited thereto. Further, the top surface of the second portion 134 is misaligned with the top surface of the first portion 132, and a bottom surface of the second portion 134 is misaligned with the bottom surface of the first portion 132. In some embodiments, the topmost surface of the second portion 134 is higher than the top surface of the first portion 132 and the topmost surface of the third portion 136. The bottom surface of the first portion 132 is higher than the bottommost surfaces of the second and third portions 134 and 136. In some embodiments, the bottom surface of the second portion 134 is aligned (i.e., coplanar) with the bottom surface of the third portion 136, as shown in FIG. 1H.

The LDMOS transistor device 100 includes the second gate structure 150*b*. In some embodiments, the second gate structure 150*b* includes the first portion 132 and the second portion 134 of the stepped isolation structure 138 serving as a gate dielectric layer. In some embodiments, the second portion 134 includes dopants from the second ion implantation 117. In such embodiments, the second portion 134 includes As, Ge, Si or inert ions, and the inert ions may include Xe, but the disclosure is not limited thereto. In some embodiments, a channel region is formed under the stepped isolation structure 138, though not shown.

Additionally, the LDMOS transistor device 100 includes isolation structures such as the STIs 106*b* disposed in the substrate 102. The STIs 106*b* define an active region wherein the LDMOS transistor device is located, and isolate the active region so as to prevent leakage current from flowing between adjacent active regions. In some embodiments, a top surface of the STIs 106*b* may be aligned with the top surface of the substrate 102. Alternatively, the top surface of the STIs 106*b* may be between the top surface of the first portion 132 and the bottom surface of the first portion 132. Further, a depth or a thickness of the STIs 106*b* is greater than the thickness of the second portion 134 of the stepped isolation structure 138.

The LDMOS transistor device 100 further includes the spacers 154 disposed over sidewalls of the second gate structure 150*b*. In some embodiments, the spacer 154 covers a portion of the third portion 136 and exposes another portion of the third portion 136 of the stepped isolation structure 138. Accordingly, bottom surfaces of the spacers 154 may be misaligned with each other, as shown in FIG. 1H.

The LDMOS transistor device 100 includes the doped regions such as the source region 156S, the drain region 156D and the body region 158. In some embodiments, the drain region 156D is adjacent to the stepped isolation structure 138, such as the third portion 136 of the stepped isolation structure 138. Additionally, the LDMOS transistor device 100 may include further doped regions and/or well regions according to various product designs.

In some embodiments, the field plate 152 is provided to maintain or increase a breakdown voltage of the LDMOS transistor device 100 by altering electric fields. In some comparative approaches, electric fields are generated and may be concentrated around the drain region 156D. However, the field plate 152 alters or modulates the electric fields between the second gate structure 150*b* and the drain region 156D, such that a depletion profile is reduced, the electric fields are deconcentrated, and a device speed is increased. Further, the field plate 152 helps lower a gate-to-drain capacitance (Cgd) and thus increases power efficiency.

Still referring to FIG. 1H, the stepped isolation structure 138 having the second portion 134 under the field plate 152 helps to reduce the on-resistance. Compared with some comparative approaches that have an STI under the field plate so as to create a bent conduction path, a straight conduction path is formed in the substrate 102 under the stepped isolation structure 138. Accordingly, the on-resistance is reduced.

FIG. 2 illustrates a flow diagram according to some embodiments of a method 20 for forming an LDMOS transistor device.

While the disclosed method 20 is illustrated and described herein as a series of acts or operations, it will be appreciated that an order of the illustrated acts or operations is not to be interpreted in a limiting sense. For example, some operations may occur in different orders and/or concurrently with other acts or operations apart from those illustrated and/or described herein. In addition, not all illustrated operations may be required to implement one or more aspects or embodiments of the description herein. Further, one or more of the operations depicted herein may be carried out in one or more separate operations and/or phases.

In operation 201, a substrate 102 is received. The substrate 102 includes a first region 104*a* and a second region 104*b*. FIG. 1A illustrates a cross-sectional view of the LDMOS transistor device 10 according to some embodiments corresponding to operation 201. Further, isolation structures 106*a* and 106*b* may be formed in the substrate 102 for defining and isolating active regions.

In operation 202, a first ion implantation 109 is performed on the substrate 102 to form a first implanted region 111 in the second region 104*b*. FIG. 1B illustrates a cross-sectional view of the LDMOS transistor device 11 according to some embodiments corresponding to operation 202.

In operation 203, a second ion implantation 117 is performed on the substrate 102 to form a second implanted region 119 in the second region 104*b*. FIG. 1C illustrates a cross-sectional view of the LDMOS transistor device 12 according to some embodiments corresponding to operation 203.

In operation 204, a first thermal operation 121 is performed on the substrate 102 to form a well region 122 in the second region 104*b*. FIG. 1D illustrates a cross-sectional view of the LDMOS transistor device 13 according to some embodiments corresponding to operation 204.

In operation 205, a second thermal operation 123 is performed on the substrate 102 to form a first dielectric layer 130, a second dielectric layer 132 and a third dielectric layer 134. FIGS. 1E and 1F respectively illustrate cross-sectional views of the LDMOS transistor devices 14 and 15 according to some embodiments corresponding to operation 205.

In operation 206, a first gate electrode 140*a* is formed over the first dielectric layer 130 and a second gate electrode 140*b* is formed over the second and third dielectric layers 132 and 134. FIG. 1G illustrates a cross-sectional view of the LDMOS transistor device 16 according to some embodiments corresponding to operation 206.

In further operations, spacers 154 and doped regions (i.e., the source region 156S, the drain region 156D and the body region 158) are formed to form the LDMOS transistor device 100. FIG. 1H illustrates a cross-sectional view of the LDMOS transistor device 100 according to some embodiments corresponding to those operations.

According to the provided method 20, the stepped isolation structure 138 replaces dual STIs, which required complicated manufacturing operations. Further, the stepped isolation structure 138 helps to maintain or improve a function of increasing breakdown voltage due to the field plate 152, and further reduces on-resistance by providing a straight conduction path.

FIGS. 3A to 3F are schematic cross-sectional views of various stages in a formation of an LDMOS transistor device according to aspects of the present disclosure in one or more embodiments. The corresponding operations are also reflected schematically in the process flow shown in FIG. 4.

It should be noted that same elements in FIGS. 3A to 3F and FIGS. 1A to 1H may include same materials; therefore, repeated descriptions of such details are omitted for brevity.

Figure 3A:
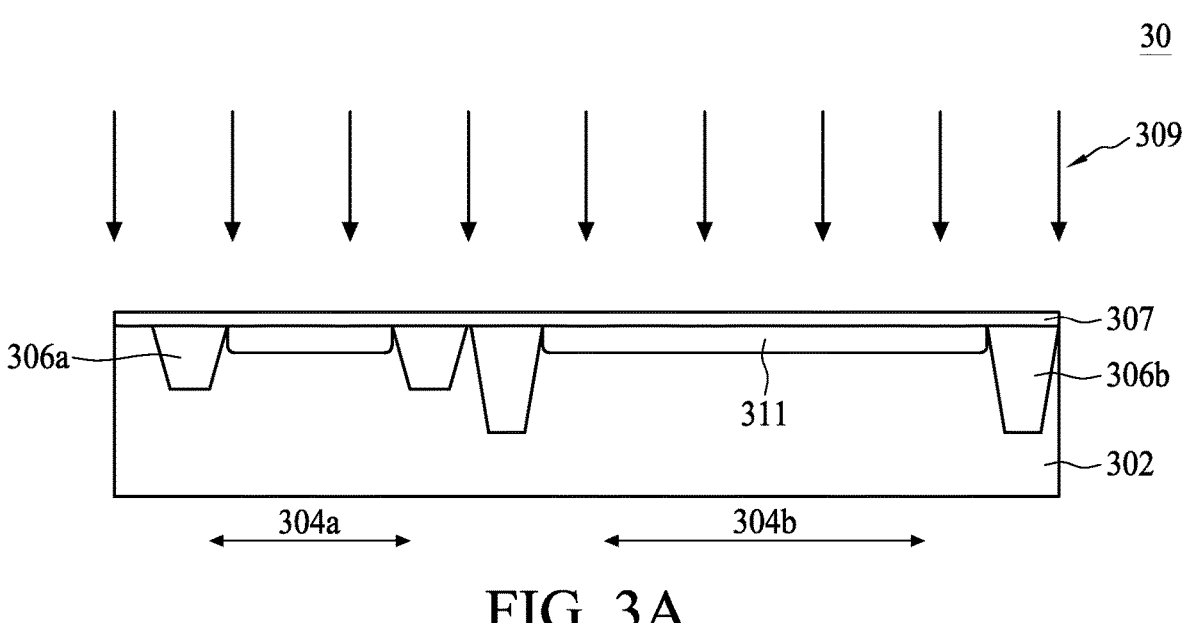
FIGS. 3A to 3F are schematic cross-sectional views of various stages in a formation of an LDMOS transistor device according to aspects of the present disclosure in one or more embodiments.

Referring to FIG. 3A, in some embodiments, a substrate 302 is received or provided. The substrate 302 has a first conductivity type. In some embodiments, the first conductivity type may be p-type. The substrate 302 may have a first region 304*a* and a second region 304*b* defined thereon. Further, the substrate 302 may include isolation structures, e.g., shallow trench isolations (STI) 306*a* and 306*b* interposing the first and second regions 304*a* and 304*b*. The first and second regions 304*a* and 304*b* are defined for accommodating different devices. As mentioned above, the first region 304*a* may be a logic region where logic devices are to be formed, and the second region 304*b* may be an LDMOS region. A depth of the STI 306*a* may be less than a depth of the STI 306*b*, but the disclosure is not limited thereto.

In some embodiments, a sacrificial layer 307 may be formed over the substrate 302. In some embodiments, the sacrificial layer 307 covers a top surface of the substrate 302 and top surfaces of the STIs 306*a* and 306*b*. As mentioned above, the sacrificial layer 307 serves as a screen layer.

Still referring to FIG. 3A, in some embodiments, a first ion implantation 309 is performed on the substrate 302 to form a first implanted region 311 in the second region 304*b*. In some embodiments, a patterned mask layer (not shown) is formed over the substrate 302 such that regions desired to be impervious to the first ion implantation 309 are covered and protected from the first ion implantation 309. In some embodiments, the first implanted region 311 may be formed in the first region 304*a*, though not shown. In some embodiments, the first ion implantation 309 implants ions or dopants of a second conductivity type, which is complementary to the first conductivity type, into the second region 304*b* and/or the first region 304*a* to form the first implanted region 311. The second conductivity type may be n-type.

Figure 3B:
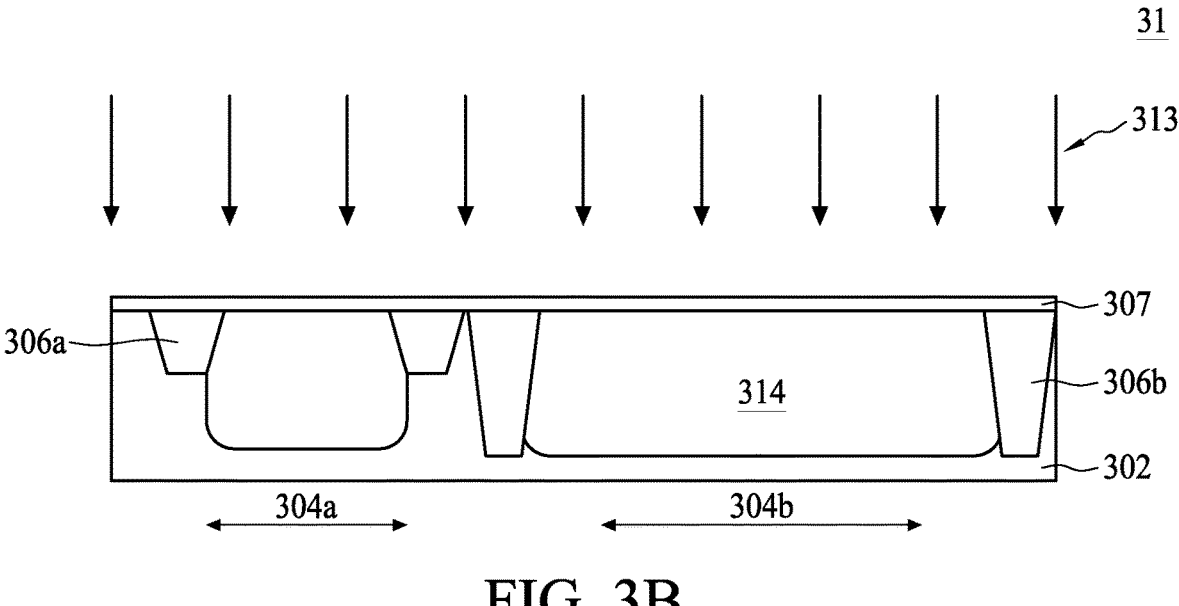

Referring to FIG. 3B, in some embodiments, a thermal operation 313 is performed on the substrate 302 after the first ion implantation 309 to form a well region 314 in the second region 304*b*. In some embodiments, the thermal operation 313 is performed to drive the ions from the first implanted region 311 into the substrate 302. Accordingly, the well region 314 is formed, as shown in FIG. 3B. In some embodiments, a bottom of the well region 314 is in contact with the substrate 302. However, in some embodiments, other well regions or doped regions may be disposed between the bottom of the well region 314 and the substrate 302, though not shown. The well region 314 can be referred to as a drift region or a high-voltage n-type well.

Figure 3C:
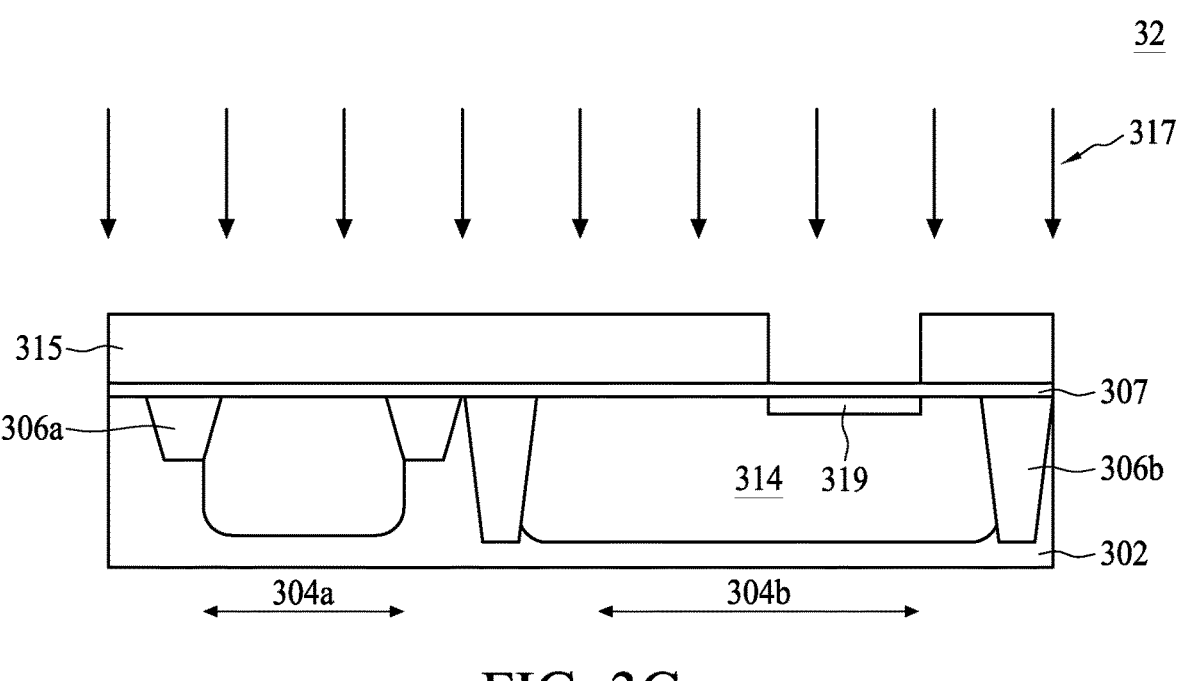

Referring to FIG. 3C, in some embodiments, a patterned mask layer, such as a patterned photoresist layer 315, is formed over the substrate 302. As mentioned above, the patterned photoresist layer 315 includes an opening exposing a portion of the second region 304*b*, and covers other portions of the substrate 302. A second ion implantation 317 is subsequently performed on the substrate 302. In some embodiments, the second ion implantation 317 implants ions such as As, Ge, Si or inert ions, but the disclosure is not limited thereto. In some embodiments, the inert ions include Xe, but the disclosure is not limited thereto. In some embodiments, a dosage of the second ion implantation 317 is between approximately $1 \times 10^{14}$ ions/cm$^2$ and $5 \times 10^{15}$ ions/cm$^2$, and an energy of the second implantation 317 is between approximately 5 KeV and approximately 30 KeV, but the disclosure is not limited thereto. Accordingly, a second implanted region 319 is formed in the second region 304*b*, as shown in FIG. 3C. A depth of the second implanted region 319 is between approximately 10 angstroms and approximately 300 angstroms, but the disclosure is not limited thereto.

Comparing FIGS. 3A and 3C, it can be observed that the second implanted region 319 is formed in the first implanted region 311. In some embodiments, the depth of the second implanted region 319 is equal to or less than a depth of the first implanted region 311. Further, an area of the second implanted region 319 is less than an area of the first implanted region 311. In other words, a width of the second implanted region 319 is less than a width of the first implanted region 311 in the cross-sectional view, as shown in FIGS. 3A and 3C.

Figure 3D:
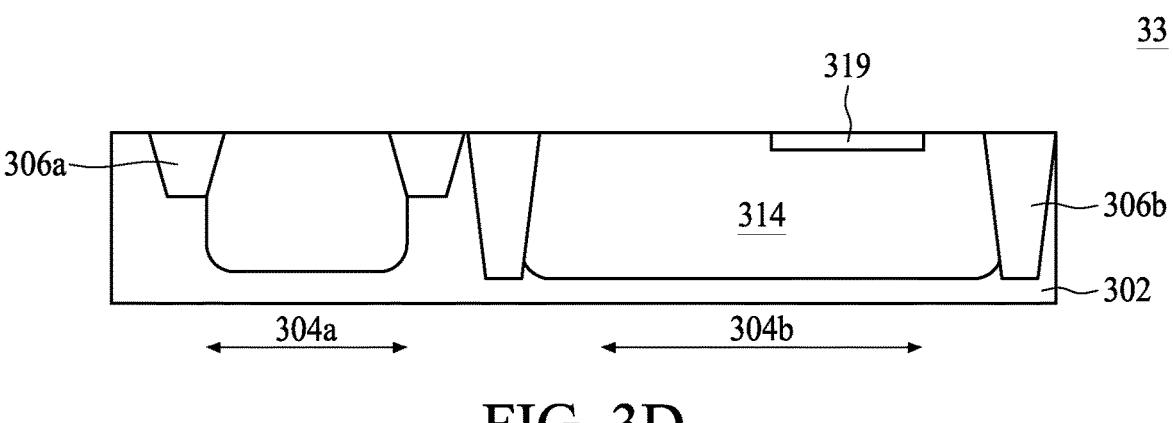

Referring to FIG. 3D, after the second ion implantation 317, the sacrificial layer 307 is removed. Accordingly, a top surface of the well region 314 and a top surface of the second implanted region 319 are exposed.

Figure 3E:
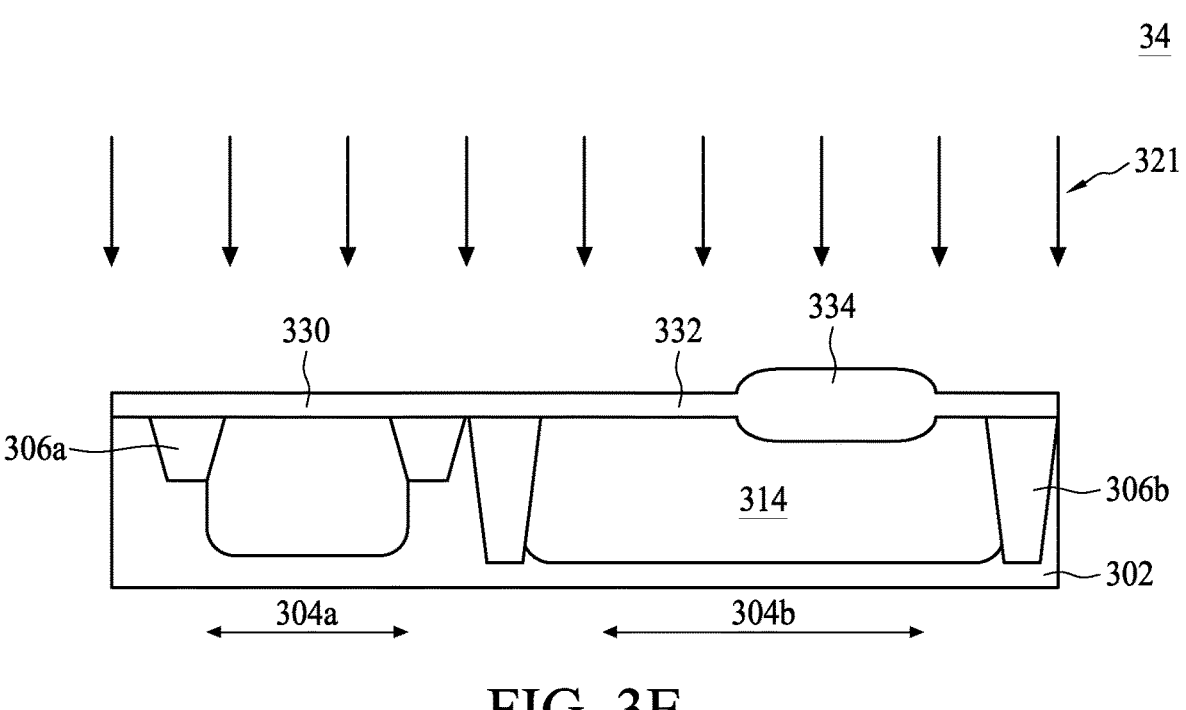

Referring to FIG. 3E, a thermal operation 321 is performed. In some embodiments, a first dielectric layer 330 is formed over the substrate 302 in the first region 304*a*, a second dielectric layer 332 is formed over the substrate 302 in a portion of the second region 304b, and a third dielectric layer 334 is formed over the substrate 302 in another portion of the second region 304b. The first, second and third dielectric layers 330, 332 and 334 are coupled together, and include a same material, such as silicon oxide. A thickness of the first dielectric layer 330 and a thickness of the second dielectric layer 332 are equal. In some embodiments, a top surface of the first dielectric layer 330 and a top surface of the second dielectric layer 332 are aligned (i.e., coplanar) with each other. Further, a bottom surface of the first dielectric layer 330 and a bottom surface of the second dielectric layer 332 are aligned (i.e., coplanar) with the top surface of the substrate 302, as shown in FIG. 3E.

As mentioned above, a lattice arrangement of the semiconductor material of the second implanted region 319 is damaged, and an oxidation rate of the semiconductor material of the second implanted region 319 is increased. Consequently, an oxide growth rate is increased. Thus, a thickness of the third dielectric layer 334 is greater than the thickness of the first dielectric layer 330 and greater than the thickness of the second dielectric layer 332. In some embodiments, the thickness of the third dielectric layer 334 may be between approximately 400 angstroms and approximately 800 angstroms, but the disclosure is not limited thereto.

Figure 3F:
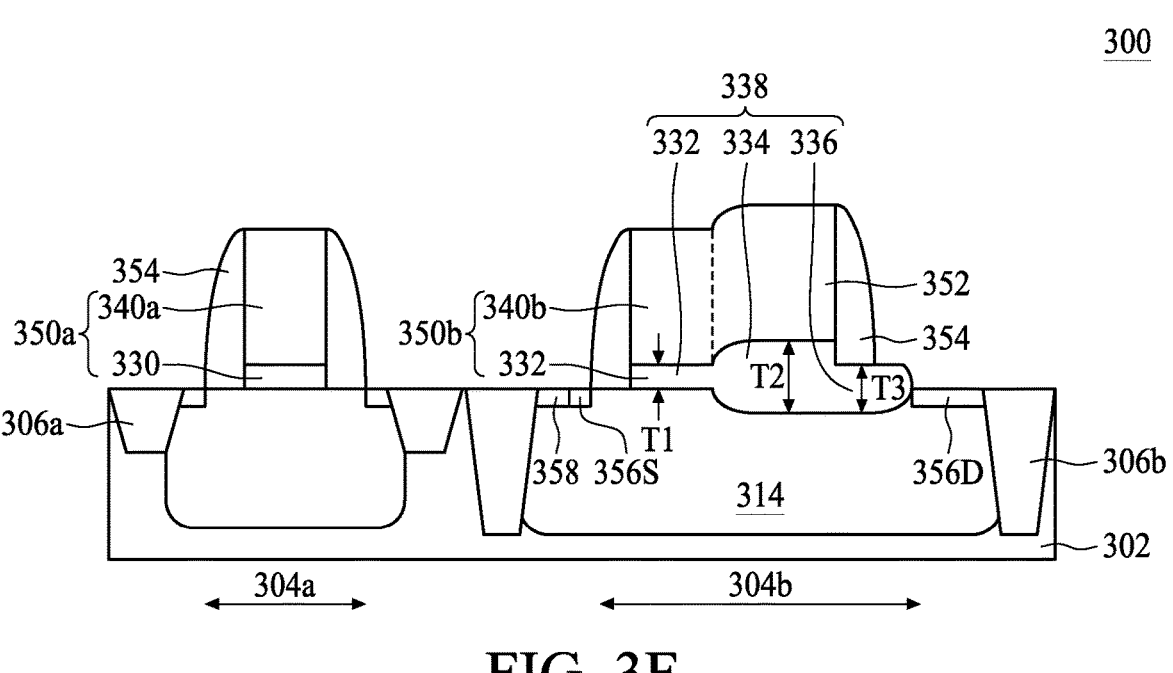

Referring to FIG. 3F, a gate layer is formed over the substrate 302 and patterned. Accordingly, a first gate electrode 340a is formed in the first region 304a, and a second gate electrode 340b is formed in the second region 304b. In some embodiments, the first dielectric layer 330 is also patterned. Thus, the gate electrode 340a and the patterned first dielectric layer 330 form a first gate structure 350a. The second gate electrode 340b is formed over the second dielectric layer 332. The second dielectric layer 332 is also patterned, and the second gate electrode 340b and the patterned second dielectric layer 332 form a second gate structure 350b. In some embodiments, the semiconductor layer is also patterned to form a field plate 352 over the third dielectric layer 334. As shown in FIG. 3F, the field plate 352 is coupled to the second gate electrode 340b. In some embodiments, a portion of the third dielectric layer 334 is covered by the field plate 352, and another portion of the third dielectric layer 334 is removed to form a fourth dielectric layer 336 that is coupled to the third dielectric layer 334. In such embodiments, a thickness of the fourth dielectric layer 336 is less than the thickness of the third dielectric layer 334. However, the thickness of the fourth dielectric layer 336 is greater than the thickness of the first dielectric layer 330 and the thickness of the second dielectric layer 332.

Still referring to FIG. 3F, spacers 354 and doped regions can be formed after the forming of the first and second gate structures 350a and 350b. As mentioned above, the doped regions may include a source region 356S, a drain region 356D and a body region 358. Other doped regions and/or well regions may be formed prior to the forming of the source region 356S, the drain region 356D and the body region 358, but the disclosure is not limited thereto.

Accordingly, an LDMOS transistor device 300 is obtained. The LDMOS transistor device 300 includes a stepped isolation structure 338 disposed over the substrate 302. The stepped isolation structure 338 has a first portion 332 (also referred to as the second dielectric layer), a second portion 334 (also referred to as the third dielectric layer), and a third portion 336 (also referred to as the fourth dielectric layer). Relationships between elements of the LDMOS transistor device 300 may be similar to those of the LDMOS transistor device 100; therefore, repeated descriptions of such details are omitted for brevity.

As mentioned above, the field plate 352 is provided to maintain or increase a breakdown voltage of the LDMOS transistor device 300 by altering electric fields. In some comparative approaches, electric fields are generated around the drain region 356D. However, the field plate 352 alters or modulate the electric fields between the second gate structure 350b and the drain region 356D, such that a depletion profile is reduced, the electric fields are deconcentrated, and a device speed is increased. Further, the field plate 352 helps lower Cgd and thus increases power efficiency. In addition, the stepped isolation structure 338 having the second portion 334 under the field plate 352 helps to reduce the on-resistance. Compared with some comparative approaches that have an STI under the field plate, a straight conduction path is formed in the substrate 302. Accordingly, the on-resistance is reduced.

FIG. 4 illustrates a flow diagram of some embodiments of a method 40 for forming an LDMOS transistor device.

While the disclosed method 40 is illustrated and described herein as a series of acts or operations, it will be appreciated that an order of the illustrated acts or operations is not to be interpreted in a limiting sense. For example, some operations may occur in different orders and/or concurrently with other acts or operations apart from those illustrated and/or described herein. In addition, not all illustrated operations may be required to implement one or more aspects or embodiments of the description herein. Further, one or more of the operations depicted herein may be carried out in one or more separate operations and/or phases.

In operation 401, a substrate 302 is received. The substrate 302 includes a first region 304a, a second region 304b, and STIs 306a and 306b for defining and isolating the regions 304a and 304b.

In operation 402, a first ion implantation 309 is performed on the substrate 302 to form a first implanted region 311 in the second region 304b. FIG. 3A illustrates a cross-sectional view of the LDMOS transistor device 30 according to some embodiments corresponding to operations 401 and 402.

In operation 403, a first thermal operation 313 is performed on the substrate 302 to form a well region 314 in the second region 304b. FIG. 3B illustrates a cross-sectional view of the LDMOS transistor device 31 according to some embodiments corresponding to operation 403.

In operation 404, a second ion implantation 317 is performed on the substrate 302 to form a second implanted region 319 in the second region 304b. FIG. 3C illustrates a cross-sectional view of the LDMOS transistor device 32 according to some embodiments corresponding to operation 404.

In operation 405, a second thermal operation 321 is performed on the substrate 302 to form a first dielectric layer 330, a second dielectric layer 332 and a third dielectric layer 334. FIG. 3E illustrates a cross-sectional view of the LDMOS transistor device 34 according to some embodiments corresponding to operation 405.

In operation 406, a first gate electrode 340a is formed over the first dielectric layer 330 and a second gate electrode 340b is formed over the second and third dielectric layers 332 and 334. FIG. 3F illustrates a cross-sectional view of the LDMOS transistor device 300 according to some embodiments corresponding to operation 406.

In further operations, spacers 354 and doped regions (i.e., a source region 356S, a drain region 356D and a body region 358) are formed to form the LDMOS transistor device 300.

FIG. 3F also illustrates a cross-sectional view of the LDMOS transistor device 300 according to some embodiments corresponding to those operations.

The present disclosure provides an LDMOS transistor device having a stepped isolation structure and a method for forming the same. In some embodiments, the method uses an implantation for forming the stepped isolation structure thereby simplifying manufacturing operations and mitigating impacts on logic devices. Accordingly, a breakdown voltage of the LDMOS transistor device is increased, an R-on of the LDMOS transistor device is reduced, and impacts on the logic devices are minimized.

According to one embodiment of the present disclosure, a method for forming a LDMOS transistor device is provided. The method includes following operations. A substrate is received. The substrate includes a first region and a second region separated from each other. A first implanted region is formed in the second region. A second implanted region is formed in the second region. An area of the second implanted region is less than an area of the first implanted region. A first thermal operation is performed to form a well region in the second region. A second thermal operation is performed to form a first dielectric layer in the first region, a second dielectric layer in the second region, and a third dielectric layer in the second region. A first gate electrode is formed in the first region, and a second gate electrode is formed in the second region. A thickness of the third dielectric layer is greater than a thickness of the first dielectric layer, and greater than a thickness of the second dielectric layer.

According to one embodiment of the present disclosure, a method for forming a LDMOS transistor device is provided. The method includes following operations. A substrate having a first conductivity type is received. A first ion implantation is performed on the substrate. The first ion implantation includes ions of a second conductivity type complementary to the first conductivity type. A second ion implantation is performed on the substrate after the first ion implantation. A first thermal operation is performed to form a well region in the substrate. A second thermal operation is performed to form a first dielectric layer and a second dielectric layer over the substrate. A thickness of the first dielectric layer is less than a thickness of the second dielectric layer. A gate electrode is formed over the first dielectric layer and the second dielectric layer.

According to one embodiment of the present disclosure, an LDMOS transistor device is provided. The LDMOS transistor device includes a stepped isolation structure over a substrate, a gate electrode disposed over a portion of the stepped isolation structure, a source region disposed in the substrate, and a drain region disposed in the substrate. The stepped isolation structure includes a first portion having a first thickness, and a second portion having a second thickness greater than the first thickness. The second portion includes dopants. The drain region is adjacent to the stepped isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a lateral diffusion metal-oxide-semiconductor (LDMOS) transistor device, comprising:
   receiving a substrate having a first region and a second region separated from each other;
   forming a first implanted region in the second region;
   forming a second implanted region in the second region, wherein an area of the second implanted region is less than an area of the first implanted region;
   performing a first thermal operation to form a well region in the second region;
   performing a second thermal operation to form a first dielectric layer in the first region, a second dielectric layer in the second region, and a third dielectric layer in the second region;
   forming a first gate electrode in the first region, and a second gate electrode and a field plate in the second region; and
   forming a source region and a drain region in the substrate in the second region after the forming of the second gate electrode,
   wherein a thickness of the third dielectric layer is greater than a thickness of the first dielectric layer, and greater than a thickness of the second dielectric layer,
   wherein a sidewall of the field plate is aligned with a sidewall of the third dielectric layer.

2. The method of claim 1, wherein the second implanted region is formed after the forming of the first implanted region.

3. The method of claim 2, wherein the first thermal operation is performed between the forming of the first implanted region and the forming of the second implanted region.

4. The method of claim 2, wherein the first thermal operation is performed after the forming of the second implanted region.

5. The method of claim 1, wherein the substrate comprises dopants of a first conductivity type, and the well region comprises dopants of a second conductivity type complementary to the first conductivity type.

6. The method of claim 1, wherein the second implanted region comprises arsenic (As), germanium (Ge), silicon (Si) or inert ions.

7. The method of claim 1, wherein the forming of the second implanted region further comprises:
   forming a patterned photoresist layer over the substrate, wherein the patterned photoresist layer comprises an opening exposing a portion of the second region;
   performing an ion implantation to form the second implanted region through the opening; and
   removing the patterned photoresist layer.

8. The method of claim 1, wherein the field plate is coupled to the second gate electrode.

9. The method of claim 1, further comprising:
   forming a sacrificial layer over the substrate prior to the forming the first implanted region; and
   removing the sacrificial layer prior to the second thermal operation.

10. A method for forming an LDMOS transistor device, comprising:

receiving a substrate of a first conductivity type;

performing a first ion implantation on the substrate, wherein the first ion implantation comprises ions of a second conductivity type complementary to the first conductivity type;

performing a second ion implantation on the substrate after the first ion implantation;

performing a first thermal operation to form a well region in the substrate;

performing a second thermal operation to simultaneously form a first dielectric layer and a second dielectric layer over the substrate, wherein a thickness of the first dielectric layer is less than a thickness of the second dielectric layer; and forming a gate electrode over the first dielectric layer and a field plate over the second dielectric layer, wherein a sidewall of the field plate is aligned with a sidewall of the second dielectric layer.

11. The method of claim 10, wherein the first thermal operation is performed between the first ion implantation and the second ion implantation, or after the second ion implantation.

12. The method of claim 10, wherein the second ion implantation comprises As, Ge, Si, or inert ions.

13. The method of claim 10, further comprising:

forming a sacrificial layer prior to the first ion implantation; and removing the sacrificial layer prior to the second thermal operation.

14. The method of claim 10, further comprising forming a source region and a drain region in the substrate.

15. The method of claim 14, wherein the drain region is adjacent to the second dielectric layer.

16. An LDMOS transistor device, comprising:

a stepped isolation structure disposed over a substrate, wherein the stepped isolation structure comprises:

a first portion having a first thickness;

a second portion having a second thickness greater than the first thickness; and a third portion having a third thickness greater than the first thickness and less than the second thickness, a gate electrode disposed over the first portion of the stepped isolation structure;

a source region disposed in the substrate;

a drain region disposed in the substrate and adjacent to the stepped isolation structure; and a spacer disposed over the third portion of the stepped isolation structure, wherein the second portion comprises dopants.

17. The LDMOS transistor device of claim 16, wherein the dopants in the second portion of the stepped isolation structure comprise As, Ge, Si or inert ions.

18. The LDMOS transistor device of claim 16, where a top surface of the second portion is misaligned with a top surface of the first portion, and a bottom surface of the second portion is misaligned with a bottom surface of the first portion.

19. The LDMOS transistor device of claim 18, wherein the top surface of the second portion is higher than a top surface of the substrate.

20. The LDMOS transistor device of claim 16, further comprising an isolation structure disposed in the substrate, wherein a top surface of the isolation structure is aligned with a top surface of the substrate or between a top surface of the second portion and a bottom surface of the second portion.

* * * * *